(12) United States Patent
Cugini et al.

(10) Patent No.: US 6,369,590 B1
(45) Date of Patent: Apr. 9, 2002

(54) APPARATUS AND METHOD USING PHOTOELECTRIC EFFECT FOR TESTING ELECTRICAL TRACES

(75) Inventors: Mario A. Cugini, Vista; Jeff Brakley, San Diego; Gilbert Norman Ravich, Lawndale, all of CA (US)

(73) Assignee: ManiaTech Incorporated, Santa Ana, CA (US)

( * ) Notice: Subject to any disclaimer, the term of this patent is extended or adjusted under 35 U.S.C. 154(b) by 0 days.

(21) Appl. No.: 09/231,410

(22) Filed: Jan. 14, 1999

(51) Int. Cl.[7] .............................................. G01R 31/00
(52) U.S. Cl. ........................ 324/752; 324/158.1; 324/96
(58) Field of Search ............................. 324/752, 751, 324/750, 753, 158.1, 96; 356/364

(56) References Cited

U.S. PATENT DOCUMENTS

| | | | | |
|---|---|---|---|---|
| 3,796,947 A | * | 3/1974 | Harrod et al. ................. | 324/51 |
| 4,837,506 A | * | 6/1989 | Patterson ..................... | 324/158.1 |
| 4,967,152 A | * | 10/1990 | Patterson .................... | 324/158.1 |
| 6,011,402 A | * | 1/2000 | Kuo et al. ..................... | 324/753 |

FOREIGN PATENT DOCUMENTS

| | | |
|---|---|---|
| EP | 0104577 | 4/1984 |

* cited by examiner

Primary Examiner—Safet Metjahic
Assistant Examiner—Jimmy Nguyen
(74) Attorney, Agent, or Firm—Gregory S. Rosenblatt; Jody Lynn DeStefanis; Wiggin & Dana

(57) ABSTRACT

A tester (10), for testing electrical trace (90T) without electrical connection to test trace (90T), generally comprises an electro-magnetic source (25), such as a laser (26) for providing a beam (39) of electro-magnetic radiation, such as of ultraviolet light, directed on a single test trace (90T) for producing a photoelectric effect on test trace (90T) liberating electrons therefrom, a collector (50) disposed near test trace (90T) for collecting liberated electrons, and a collector circuit (60) electrically connected to collector (50) for supplying a positive potential thereto and including a meter (70) for measuring the photoelectric current to collector (50) from trace (90T).

17 Claims, 2 Drawing Sheets

APPARATUS AND METHOD USING PHOTOELECTRIC EFFECT FOR TESTING ELECTRICAL TRACES

FIELD OF THE INVENTION

This invention relates to the testing, such as for size, opens and shorts, of electrical traces, such as on a substrate such as a circuit board, and more specifically relates to a method using the photo-electric effect wherein the trace is not physically contacted.

BACKGROUND OF THE INVENTION

In the current manufacture of electronic components, the packing density has increased considerably, resulting in traces of extremely small size. Fabrication of such traces is difficult such that defects are more common. Therefore, testing the quality of fine traces has become increasingly more important.

Most conventional methods of trace testing involve physically contacting the trace with one or two test probes. The physical placement accuracy of test probes limit their use in testing in mass. Many current traces are so small or densely packed that they can only be contacted with a physical probe individually with a very time consuming and uneconomical visual process.

Therefore, there has been a need for a test method for fine traces in which the trace is not physically contacted and which is not unduly time consuming.

SUMMARY OF THE INVENTION

This invention is a tester for testing an electrical trace without electrical connection to the test trace and it generally comprises an electro-magnetic source, such as a laser for providing a beam of electro-magnetic radiation directed on a single test trace for producing a photo-electric effect on the test trace liberating electrons from the trace, a collector disposed near the trace for collecting liberated electrons, and a collector circuit electrically connected to the collector for supplying a positive potential thereto and including a meter for measuring the photoelectric current to the collector from the trace. Preferably, the collector is a wire grid or a transparent sheet including a surface facing the test trace having a thin metal film thereon. In a preferred embodiment, trace and collected are placed in a vacuum chamber.

The method comprises directing an electro-magnetic beam on the test trace for producing a photo-electric effect on the test trace, liberating electrons from the trace, disposing a collector near the trace for collecting electrons liberated by the photo-electric effect on the trace, supplying a positive potential to the collector, and measuring the photoelectric current to the collector from the trace.

Other features and many attendant advantages of the invention will become more apparent upon a reading of the following detailed description together with the drawings in which like reference numerals refer to like parts throughout.

DETAILED DESCRIPTION OF THE INVENTION

Figure 1:
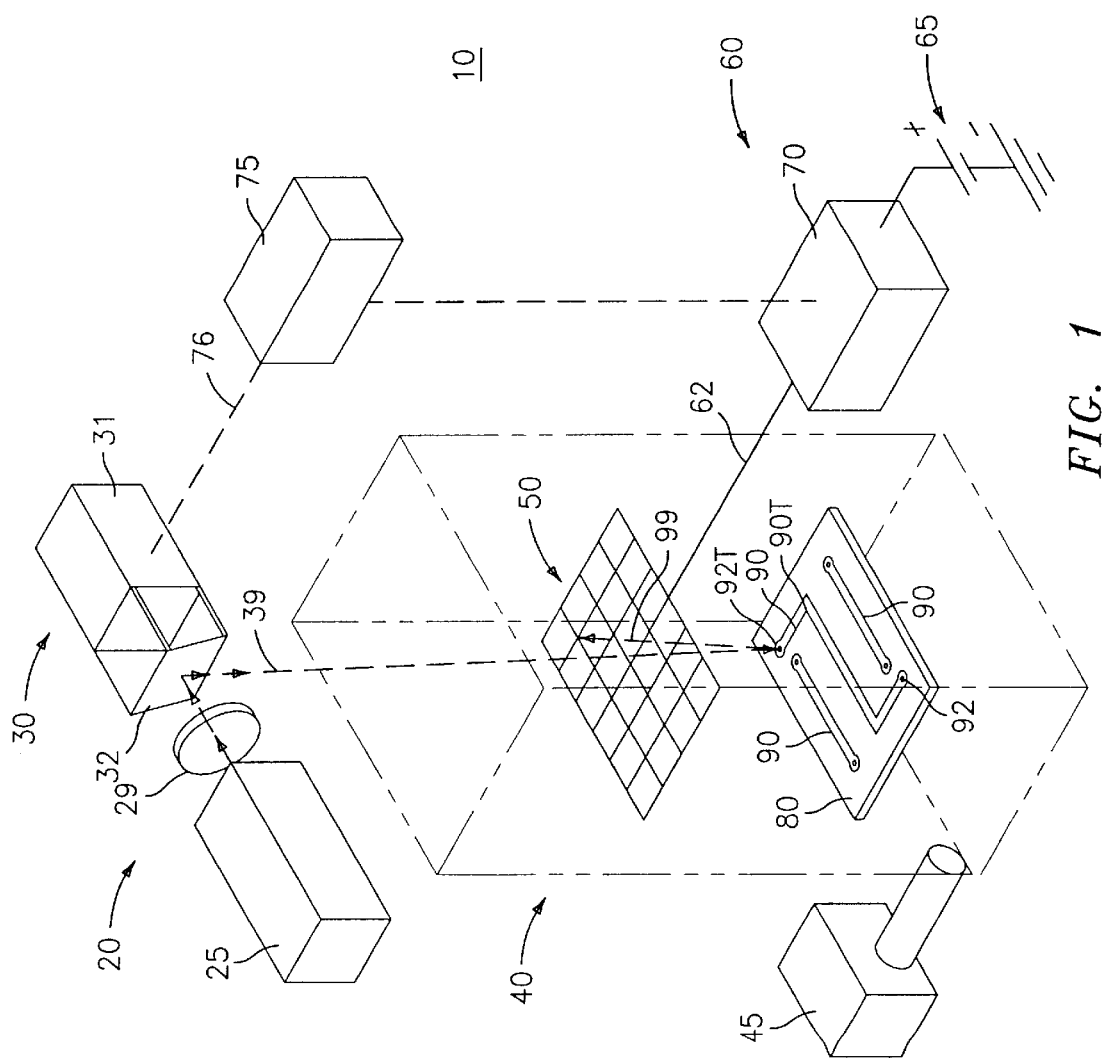
FIG. 1 is a schematic representation of a preferred embodiment of the apparatus of the invention.

With reference now to the drawings, FIG. 1 is a schematic representation of a preferred embodiment of the trace tester 10 of the invention. Trace tester 10 generally comprises electro-magnetic source means 20, vacuum chamber 40, collector 50, collector circuit 60 including meter 70, and controller 75.

Vacuum chamber 40 may be of conventional well-known design and includes a vacuum pump 45 for producing a "rough" vacuum in the neighborhood of 0.1 torr and includes means for selectively venting the interior to atmosphere and for accessing the interior for insertion of test pieces and the like. The use of vacuum chamber 40 aids in the efficiency of the device.

A substrate, such as printed circuit board 80, containing electrical traces 90 is placed in vacuum chamber 40. Preferably, all traces 90 are at a known voltage or are given a known voltage by any of several means well-known in the art. For example, traces 90 can be given zero or neutral voltage by several well-known methods, such as by passing substrate 80 between grounding rollers. A first test trace is indicated as 90T. Typically, at an extremity of each trace 90 is an end pad 92. Substrate 80 may be supported in vacuum chamber 40 by any suitable means that does not interfere with the working of tester 10, that is any support cannot short out or induce voltages in test trace 90T.

Electro-magnetic source means 20 includes an electro-magnetic source 25 for providing a beam 39 of electro-magnetic radiation capable of producing a photo-electric effect on test trace 90T, thereby liberating electrons from test trace 90T. Preferably, electro-magnetic source 25 emits beam 39 of electro-magnetic radiation with a wavelength of approximately 300 nanometers or less, that is in the short wavelength ultraviolet region. A satisfactory ultraviolet electro-magnetic source 25 for most purposes is an ultraviolet laser having an emitted beam 39 that is focused, such as by lens 29, to approximately 0.003" diameter.

Beam 39 emitted by electro-magnetic source 25 must be directed to test trace 90T and not to any of the other traces 90. To accomplish this, beam 39 must be narrow or focused and must be properly directed. Electro-magnetic source means 20 includes director 30 for directing beam 39 to a specific spot on test trace 90T, such as test end pad 92T. Preferably, as shown, director 30 directs beam 39 by manipulating the beam 39 and not by moving laser 26. A mirror 32 is positioned by positioner 31 to deflect beam 39 to the desired location. Positioner 31 may include a plurality of servo motors. Preferably, positioner 31 includes or is connected, such by connector 76, to a computer such as controller 75. Controller 75 has a mapping of traces 90 and is programmed to sequentially control and move beam 39 at selected times to desired test areas.

Beam 39 is directed on a single test trace 90T, typically on an end pad 92 such as test pad 92T and produces a photo-electric effect whereby electrons are liberated from test trace 90T.

Collector 50 is disposed near test trace 90T for collecting electrons liberated by the photo-electric effect on test trace 90T. Collector circuit 60 is connected by connector 62 to collector 50, and includes a potential source 65 which supplies a potential to collector 50 and includes a meter 70 for detecting the photoelectric current to collector 50 from test trace 90T. The specifications for these elements are interdependent. Potentials may be in the range of 5–300 volts. In a preferred embodiment, collector 50 is a 0.015" grid of 0.001" wire having a potential of 10 volts disposed 3 mm. from test trace 90T having zero potential. Collector 50 may be a thin, transparent film sheet, such as of 0.002" thickness teflon, having a surface facing test trace 90T coated with a controlled amount of metal deposit, such as with a thin metal film, such as produced by sputtering. A sputtered metal film having a thickness of 1–3 angstroms has been used.

The electric field resulting from the potential difference between test trace 90T and collector tends to force photoelectrons released from test trace 90T to move to collector 50 thereby creating an electric current 99. Collector circuit 60 is of standard type, well-known and easily devised. Meter 70 typically detects the magnitude of current 99 to collector 50 and transmits this information, or the integral of this over a time period, to controller 75. Controller 75 compares the detected information with predetermined expected parameters for test trace 90T resulting in a pass or fail for test trace 90T.

Figure 2:
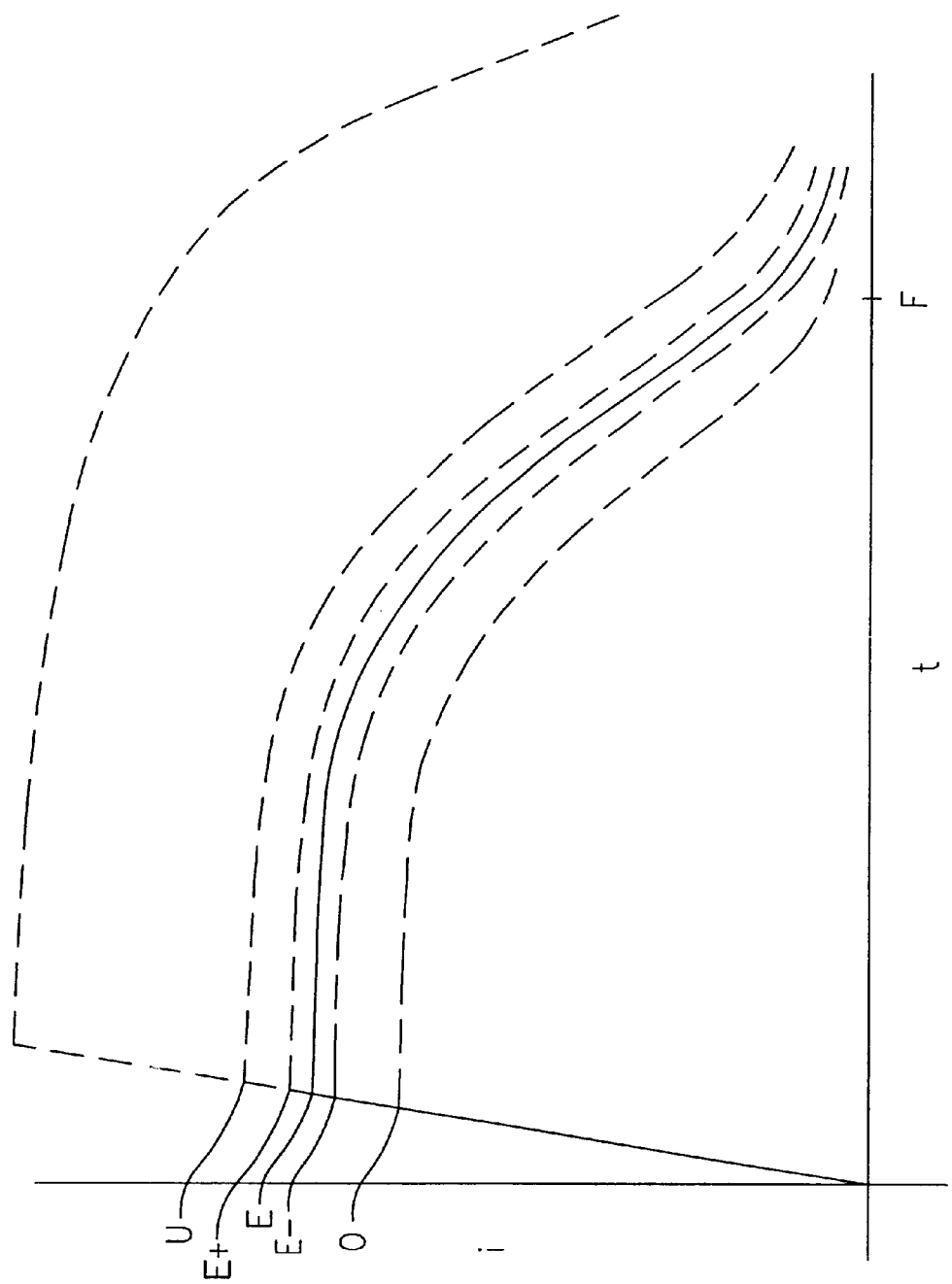
FIG. 2 is a graph for evaluating and interpreting photoelectric current from the test trace to the collector over time.

FIG. 2 is a graph for evaluating and interpreting photoelectric current from test trace 90T to collector 50 over time. The number of photoelectrons first liberated from test trace 90T reaches a maximum and then tapers off because photoelectrons must migrate to the beam site and because the potential on test trace 90T starts approaching that of collector 50. Eventually, the potential of test trace 50 is sufficiently high that no current flows. The total number of electrons liberated is largely a function of the surface area and capacitance of test trace 90T.

Current E indicates the predetermined current for that test trace. Detected current falling between error currents E+ and E− indicate acceptable current and, therefore, an acceptable trace. A detected current slightly below E−, such as between E− and O, indicates the trace is slightly too small, likely from over etching. A detected current below O likely is indication of an open. A detected current slightly above E+, such as between E+ and U, indicates that the trace is too big, likely from under etching. A detected current above U is an indication of a short. The differences in current flow are small and hard to detect. Therefore, for increased accuracy, the integral, i.e. the area under the curves to a predetermined time, such as time F, are compared to target criteria for acceptability. Controller 75 compares the detected area to predetermined areas for pass/fail.

The proper interpretation of the current detection data or further proving of the data can be done by moving beam 39 to another end pad 92 on test trace 90T. Ideally, no current should be detected. If a current is detected, it would indicate an open between that pad and the remainder of test trace 90T.

Having described the invention, it can be seen that it provides a very convenient device for testing fine electrical traces. Although a particular embodiment of the invention has been illustrated and described, various changes may be made in the form, composition, construction, and arrangement of the parts without sacrificing any of its advantages. For example, if test trace 90T has end pads 92 that can only be accessed on the other side of substrate 80, then it can be that the elements shown can be so arranged or duplicated so as to direct a beam to that pad 92 and collect and detect any resulting current. Therefore, it is to be understood that all matter herein is to be interpreted as illustrative and not in any limiting sense, and it is intended to cover in the appended claims such modifications as come within the true spirit and scope of the invention.

We claim:

1. A tester for testing an electrical trace without electrical connection to the test trace comprising:
   a substrate with a test trace at a neutral voltage;
   a vacuum chamber for containing said substrate, wherein said vacuum chamber creates a rough vacuum and wherein said substrate is supported without electrical contact to the tester;
   electromagnetic source means for providing a beam of electro-magnetic radiation directed on a single test trace for producing a photoelectric effect on the test trace;
   a collector disposed near the trace for collecting electrons liberated by the photo-electric effect on the trace;
   a collector circuit electrically connected to said collector for supplying a positive potential thereto and including:
   a meter for measuring the photo-electric current to said collector from the trace.

2. The tester of claim 1 wherein the electro-magnetic beam is directed to no other trace.

3. The tester of claim 1 wherein said electro-magnetic source means includes a laser.

4. The tester of claim 1 wherein said electro-magnetic source means includes a mirror and the electro-magnetic beam is directed by said mirror to the test trace.

5. The tester of claim 1 wherein said collector includes a wire grid.

6. The tester of claim 1 wherein said collector includes a transparent sheet including a surface facing the test trace having a thin metal film thereon.

7. The tester of claim 1, wherein the rough vacuum of said vacuum chamber is approximately 0.1 torr.

8. A method of testing an electrical trace without electrical connection to the test trace comprising:
   providing a substrate with a test trace at a neutral voltage in a vacuum chamber, wherein sad vacuum chamber creates a rough vacuum and wherein said substrate is supported without electrical contact to the tester;
   directing an electro-magnetic beam on the test trace for producing a photo-electric effect on the test trace, liberating electrons from the trace;
   disposing a collector near the trace for collecting electrons liberated by the photo-electric effect on the trace;
   supplying a positive potential to the collector; and,
   measuring the photo-electric current to the collector from the trace.

9. The method of claim 8 wherein the collector includes a wire grid.

10. The method of claim 8 wherein the collector includes a transparent sheet including a surface facing the test trace having a thin metal film thereon.

11. The method of claim 8 further including:
    producing the directed electro-magnetic beam with a laser.

12. The method of claim 8 where the step of directing the electro-magnetic beam to the test trace uses a mirror.

13. The method of claim 8 further including:
    comparing the measured current to a predetermined target current.

14. The method of claim 8 further including:
    comparing the integral of measured current over a predetermined time to a predetermined target integral.

15. The tester of claim 8, wherein the rough vacuum of said vacuum chamber is approximately 0.1 torr.

16. A method of testing an electrical trace without electrical connection to the test trace comprising:
    disposing a substrate with a test trace at a neutral voltage in a vacuum chamber such that said substrate is supported without electrical contact to the tester and a collector in proximity to said test trace for collecting electrons liberated by photo-electric effect on the trace;

evacuating air from the chamber to create a rough vacuum;

directing an electro-magnetic beam on the test trace for producing a photo-electric effect on the test trace, liberating electrons from the trace;

supplying a positive potential to the collector; and measuring the photo-electric current to the collector from the trace.

17. The tester of claim 16, wherein the rough vacuum of said vacuum chamber is approximately 0.1 torr.

* * * * *